(12) United States Patent
Huang et al.

(10) Patent No.: US 7,583,506 B1
(45) Date of Patent: Sep. 1, 2009

(54) MULTI OPERATIONAL SYSTEM APPARATUS AND METHOD

(75) Inventors: James P. Huang, Huntington Beach, CA (US); Russell M. Abbott, Riverside, CA (US); David J. Nakamura, La Palma, CA (US); Leslie A. Momoda, Los Angeles, CA (US); Kevin J. Rooney, West Hills, CA (US); Bruce L. Drolen, Altadena, CA (US); John H. Belk, St. Louis, MO (US); William Barvosa-Carter, Ventura, CA (US); Brian R. Foy, Cypress, CA (US)

(73) Assignee: The Boeing Company, Chiacgo, IL (US)

( * ) Notice: Subject to any disclaimer, the term of this patent is extended or adjusted under 35 U.S.C. 154(b) by 137 days.

(21) Appl. No.: 11/250,817

(22) Filed: Oct. 14, 2005

(51) Int. Cl.
*H05K 7/20* (2006.01)
(52) U.S. Cl. .................. 361/719; 174/252; 361/700; 361/704
(58) Field of Classification Search .............. None
See application file for complete search history.

(56) References Cited

U.S. PATENT DOCUMENTS

| | | | | |
|---|---|---|---|---|
| 5,180,645 A | * | 1/1993 | More ........................ | 429/127 |
| 5,831,333 A | * | 11/1998 | Malladi et al. .............. | 257/712 |
| 6,137,671 A | * | 10/2000 | Staffiere .................... | 361/311 |
| 6,201,701 B1 | * | 3/2001 | Linden et al. ............... | 361/720 |
| 6,353,540 B1 | * | 3/2002 | Akiba et al. ................ | 361/794 |
| 6,365,260 B1 | * | 4/2002 | Stecher et al. .............. | 428/138 |
| 6,490,159 B1 | * | 12/2002 | Goenka et al. .............. | 361/700 |
| 6,568,638 B1 | | 5/2003 | Capots | |
| 6,750,403 B2 | * | 6/2004 | Peterson .................... | 174/255 |
| 6,903,938 B2 | * | 6/2005 | Waffenschmidt ........... | 361/779 |
| 6,986,199 B2 | * | 1/2006 | Arnold et al. ............... | 29/832 |
| 2004/0211590 A1 | * | 10/2004 | Tagi et al. .................. | 174/255 |
| 2004/0218366 A1 | * | 11/2004 | Speigl ....................... | 361/720 |
| 2004/0240183 A1 | * | 12/2004 | Ishizaki ..................... | 361/719 |
| 2006/0023439 A1 | * | 2/2006 | Fraley et al. ............... | 361/780 |
| 2007/0151708 A1 | * | 7/2007 | Touzov .................. | 165/104.26 |

OTHER PUBLICATIONS

Barnett, D. M et al., "Multifunctional Structures (MFS) technology demonstration on New Millennium Program (NMP) Deep space 1 (DS1)—DS1 Technology Validation Report", Lockheed Martin, Astronautics Division, Denver CO, 16 pages, (1999).

(Continued)

*Primary Examiner*—Gregory D Thompson
(74) *Attorney, Agent, or Firm*—Rozenblat IP LLC

(57) ABSTRACT

An apparatus may have a multilayered support base having a structural section made up of operating components and a function support section. The function support section may have transmission paths and components to supply thermal, power transmission, information and communication paths, along with other functions. At least some of the components may be heat generating and may have a thermal interface surface which may be in operating and heat conductive relationship with a heat conductive substrate/routing section which may have operative connections to the multilayered support base. Some of the components may transmit and receive with one another through the substrate/routing section.

20 Claims, 13 Drawing Sheets

OTHER PUBLICATIONS

Thomas, J. P. et al., "The Design and Application of Multifunctional Structure-Battery Materials Systems" Journal of Materials, 9 pages, (2005).

Christodoulou L. et al., "Multifunctional Materials Systems: The First Generation," JOM, 55 (12), pp. 39-45, (2003).

Thomas, J.P. et al., "Multifunctional Structure-plus-Power concepts," Paper #AIAA-2002-1239, Paper presented at the 43rd AIAA/ASME/ASCE/AHS/ASC Structures, Structural Dynamics, and Materials Conference, Denver, CO., 11 pages, (2002).

Qidwai, M.A. et al., "Multifunctional Applications of Thin Film Li Polymer Battery Cells," Material Science forum, 492-493, pp. 157-162, (2005).

* cited by examiner

MULTI OPERATIONAL SYSTEM APPARATUS AND METHOD

BACKGROUND OF THE INVENTION

1. Field of the Invention

The embodiments of the present invention relate to a multi operational system, apparatus and method with an improved heat transfer design for both more efficient thermal control and dissipation of heat and improvements in functional connections between the components of the system.

2. Background Art

There are various industrial applications where it is necessary to maintain a relatively stable operating temperature environment for various components so that these can more properly perform their intended functions. For example, for satellites, spacecrafts and the like to maintain a relatively stable operating temperature environment for onboard equipment, and there are provided thermal paths from these components to heat sinks (e.g. a radiator). A thermal path is typically constructed with interfacing materials, e.g. room temperature vulcanizing silicon rubber (RTV), heat pipe, flanges (e.g. as interfaces to heat pipes), face sheet, radiator and other necessary components to conduct heat from the source (e.g. an active electric or electronic device) to sink (e.g. the radiator). Due to the nature of present day designs and the material used, the thermal system is somewhat lacking in efficiency in that a temperature gradient, e.g. about 65° C. for a typical communications satellite, typically exists between the source and the heat sink.

Another situation which exists in various operating systems, such as those in satellites and spacecraft and other industrial applications is that there are specific components Which are unique to the function or mission which is to be accomplished, and in the case of spacecraft and satellites are unique to the payload which is to be carried into outer space or its other location of use. For example, each satellite is generally custom tailored and optimized for a certain mission or payload.

Further, in the aerospace industry the satellite subsystem components are usually providing a single housekeeping function (e.g. power, thermal structural mechanical, etc.). Therefore the customizing of each design for the various components translates into engineering efforts needed to modify existing designs, remanufacture parts, retest and other related activities. For example, specific design solutions are required to insure equipment is properly wired, powered, structurally supported and thermally managed.

By way of further example, in the aerospace industry as well as other areas of the transportation industry the vehicle is produced by assembling and integrating components from different subsystems, (e.g. structure, power, control and actuation, thermal management, communication, navigation, engine/propulsion, etc.). Then there must be a plurality of connections of various kinds, and these connections can be wire, cable, waveguide, switches, valves, other control devices, and often devices are necessary to interconnect components for purposes such as data communication, power distribution, vehicle operations control, and thermal management.

The result is that the end product usually has a large amount of connectors and interconnecting links. This complexity and also the numerous interconnections lead to reduced performance and waste. For example, the reliability of the various subsystem is often far below that which is achieved in providing the structure and this becomes evident in view of the engineering practice to treat the reliability of a structure relative to the reliability of everything else as a fraction of what is achieved in the structure, since these other systems would deteriorate more quickly with time and usage.

As another example, every connector produces performance degradation, (e.g. in terms of electrical conductivity, signal noise, thermal conductivity, and mechanical strength). Also transmission through interconnections creates waste (e.g. power dissipation through distribution becoming heat and a potential thermal issue) and further reduction in performance (e.g. reduction in signal strength through transmission media). In the transportation industry this would be true for most all vehicles ranging from spacecraft, automobile, to train, aircraft and ship.

Also, in the prior art there is the concept of "smart skin," which involves embedding sensors and actuating devices at or beneath the surface of a structural element (such as a wing on aircraft) so that external conditions (e.g. aerodynamic pressure) can be sensed and adjustments can be made (e.g. changing the size, shape, or angle of the wing) to enable the aircraft to operate optimally under a given operating environment. One major issue in implementing the smart skin concept is the complexity involved in powering the sensors and actuation devices, collecting data and status from sensors and actuators and also delivering commands to the sensors and actuators.

It is toward these types of challenges that the embodiments of the present invention are directed.

SUMMARY OF THE INVENTION

The present invention relates to an operating assembly comprising a multilayered support base and an operating section.

The base comprises a structural section comprises a plurality of structural layers, each of which has upper and lower structural layer surfaces. The base further comprises a function support section that in turn comprises a plurality of vertically spaced function support regions which are located at, or adjacent to, pairs of structural layer surfaces. The function support section further comprises a plurality of function support transmission paths. The function support components comprise a heat dissipating section and one or more of thermal control components, power supply and distribution components, digital and/or analog information and/or signal transmission components and communication and/or receiving components.

The operating section comprises a plurality of operating components at least some of which are heat generating components, having a thermal interface surface. There is also a heat conductive substrate/routing section having a thermal interface surface region, with at least some of said heat generating components being mounted to said substrate/routing section in a manner that at least some of the heat generating components are in heat transfer engagement with a thermal interface surface region of the substrate/routing section.

At least some of the operating components are operatively connected to said base so that said function support section and said operating section are arranged to be functionally interconnected with one another so that functional support would be provided to one or more of said operating components from said function support section.

In one or more of said embodiments, at least some of said heat generating components have their thermal interface surfaces engaging the thermal interface surface region of the substrate/routing section. The substrate/routing section extends laterally from said thermal interface surfaces of at least some of said heat generating components to conduct heat from said heat generating components laterally through said substrate/routing section.

Also, in at least one or more of said embodiments, the substrate/routing section has another thermal interface region located oppositely to the other thermal interface surface region of the substrate/routing section. Another opposite thermal interface surface would be in heat engaging relationship with a thermal interface region of the base.

The base may further comprise a heat sink, and a function support transmission path of the base which is in thermal communication with the oppositely located surface portion of the substrate/routing section.

There may be a plurality of operating components mounted to the heat conductive substrate/routing section spaced from one another and the substrate/routing section is structured to perform routing functions through the substrate/routing section between at least some of operating components.

In one or more embodiments, at least one or more of the structural layers has sufficient structural strength to provide structural support in the base member for said operating components and said function support components. Also, in at least some of these embodiments, the thermal path or paths or thermal interface surface or surfaces comprise at least in part carbon nanotubes.

In the method of the present invention, there is provided the function support and thermal control for operating components in the assembly. This method comprises providing the components as described above, and operatively connecting at least some of the operating components to the base so that the function support section and the operating section are arranged to be functionally interconnected with one another. Thus, functional support is provided to one or more of the operating components and/or at least some of the operating components are connected with one another through the substrate/routing section to transmit and/or receive with one another through said substrate/routing section.

Other features of the present invention will become apparent by reviewing the following text.

DESCRIPTION OF THE EMBODIMENTS OF THE INVENTION

Figure 1:
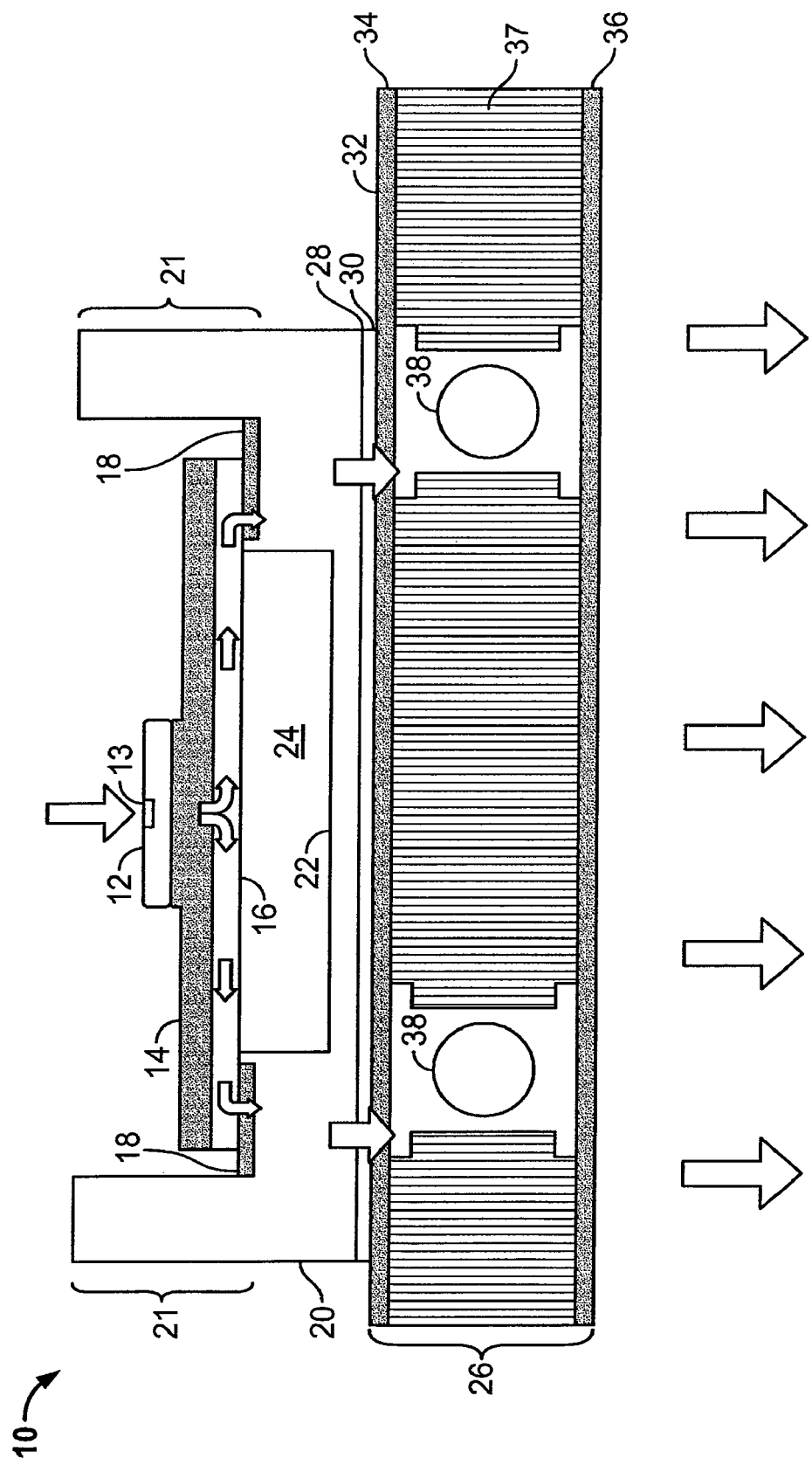
FIG. 1 is a side elevational view, partly in section, illustrating a prior art system for mounting various electronic/electrical components.

The embodiments of the present invention were designed to operate in an outer space environment such as encountered by satellites, spacecraft and the like. Accordingly, in the following text and in the drawings, these embodiments are described and shown as being incorporated in that outer space environment. However, it needs to be recognized that the basic principals of these embodiments could be applied to other applications such as other vehicles in the transportation industry (aircraft, automobiles, trains, boats, etc.), as well as possibly other industrial applications which could benefit from utilizing the principals of this embodiment of the invention.

The first embodiment of the present invention relates to an operating assembly and also design features which can be beneficially incorporated in this operating assembly, and in this instance is designed for use in a spacecraft. It is believed that a better understanding and appreciation of the embodiments of the present invention and its benefits will be better understood if a description of these embodiments is preceded by a brief discussion of some of the basic problems in the prior art and a description of at least one example of how components are mounted and interconnected and how heat control is accomplished. Then the embodiments of the present invention will be described.

a) Discussion of an Example of Aerospace Related Prior Art

In the aerospace industry, current satellite electronics payloads are generally comprised of various electronic units or boxes performing various functions, and these are mounted to a spacecraft panel. The electric and electronic units contain power supplies, telemetry, command, microwave, analog and digital electronics to form a communication, signal processing, as well as spacecraft critical functions. Each unit will contain various electric and electronic components and devices mounted to circuit boards, which are subsequently mounted to the chassis of the unit. Thermal energy that is generated in each of these units and is dissipated via conduction through the chassis and through the spacecraft's mounting surface, then on to a thermal radiator panel. The thermal radiator panels radiate the thermal energy into outer space, and are also able to receive solar energy.

As a result, there are many thermal interfaces between the heat generated in the electronic devices to the radiating thermal panel on the spacecraft. The thermal energy has to travel a considerable distance, and beyond that there are many thermal interfaces that will drive up the operating temperature of the electronic components, typically MMIC (Millimeter Microwave Integrated Circuit) and ASIC (Application Specific Integrated Circuit) components.

Usually, electronic components are constrained to operate at a fixed junction temperature in order to meet the reliability prediction for the spacecraft payload. A second constraint is thermal balance of the spacecraft payload and its ability to radiate the payload thermal energy to space.

With reference now to FIG. 1, there will be described a prior art mounting and thermal control section 10 of a type that has been used in space satellites for a number of years. This thermal control section 10 comprises an electronic component, such as a MMIC/ASIC DIE 12 which has a heat generating active region 13. This MIMIC/ASIC DIE 12 is mounted to a central portion of the upper surface of a rectangular planar substrate/routing member 14 which is immediately below the MMIC/ASIC die 12 and which extends beyond the perimeter of the MMIC/ASIC die 12. This substrate/routing layer 14 serves two functions. First, structurally this member 14 is a single or multi-layer printed wiring board which has operative connections with the electronics of the MMIC/ASIC DIE 12. Second, the member 14 is made with a heat conductive material so that it absorbs heat from the MMIC/ASIC DIE 12.

The thermal control section 10 also comprises a carrier/header 16 which is made as flat rectangular layers extending below the entire substrate/routing layer 14, and made of a heat conductive material (such as Kovar, Silvar, Moly or others known in the prior art). The upper surface of the carrier/header 16 is in close thermal contact with the entire lower surface of the substrate/routing layer 14 and the carrier/header absorbs the heat from the substrate/routing layer 14 with the heat being conducted from a center location to the perimeter portions of the carrier/header 16.

More specifically, the carrier/header 16 has its perimeter portions resting on, and in intimate thermal contact with, a perimeter ledge portion 18 of a housing structure 20 (i.e. chassis). In the particular design shown herein, this housing structure 20 (i.e. chassis), has outwardly of the ledge 18 an upwardly extending perimeter portion 21, and also a floor panel 22 lying in the same plane as the lower part of the ledge portion 18 and covering the region within the edge portion 18. Above the bottom panel or floor 22 there is an empty air space or vacuum space 24 which may optionally be provided to house other components or possibly for other purposes.

In an actual installation there could be a large number of these thermal control sections 10 which would be in close to (or in reasonable proximity with) one another and are mounted to a base member. Then there are in this prior art arrangement the exterior wires and/or cables that would make the necessary connections from the substrate/routing components and/or the thermal control sections 10, each of which would in turn would be mounted to the base member such as the honeycomb panel 26 described below.

This honeycomb panel 26 is positioned immediately below the lower planar surface 28 of the housing floor 22, with a relatively thin housing/panel interface layer 30 positioned between the bottom planar surface 28 and the upper surface 32 of the honeycomb panel. This interface layer 30 is made from a heat conductive material, such as an RTV adhesive, (which could be an epoxy adhesive), and is in intimate contact with both of the surfaces 28 and 32.

The honeycomb panel 26 is made up of upper and lower surface plates 34 and 36, with the honeycomb core 37 positioned between the two plates 34 and 36. This honeycomb panel 26 serves a structural function, and also a heat conduction function. The structural components of the panel 26 may be made of aluminum with its heat conductive capability, and there are also heat transfer components positioned within the honeycomb. For example, there is shown somewhat schematically, a pair of heat pipes 38 located within the honeycomb structure.

With the forgoing description of a prior art mounting and thermal control section being completed, there will now be provided a description of the embodiments of the present invention.

b) First Embodiment of the Invention

Figure 2:
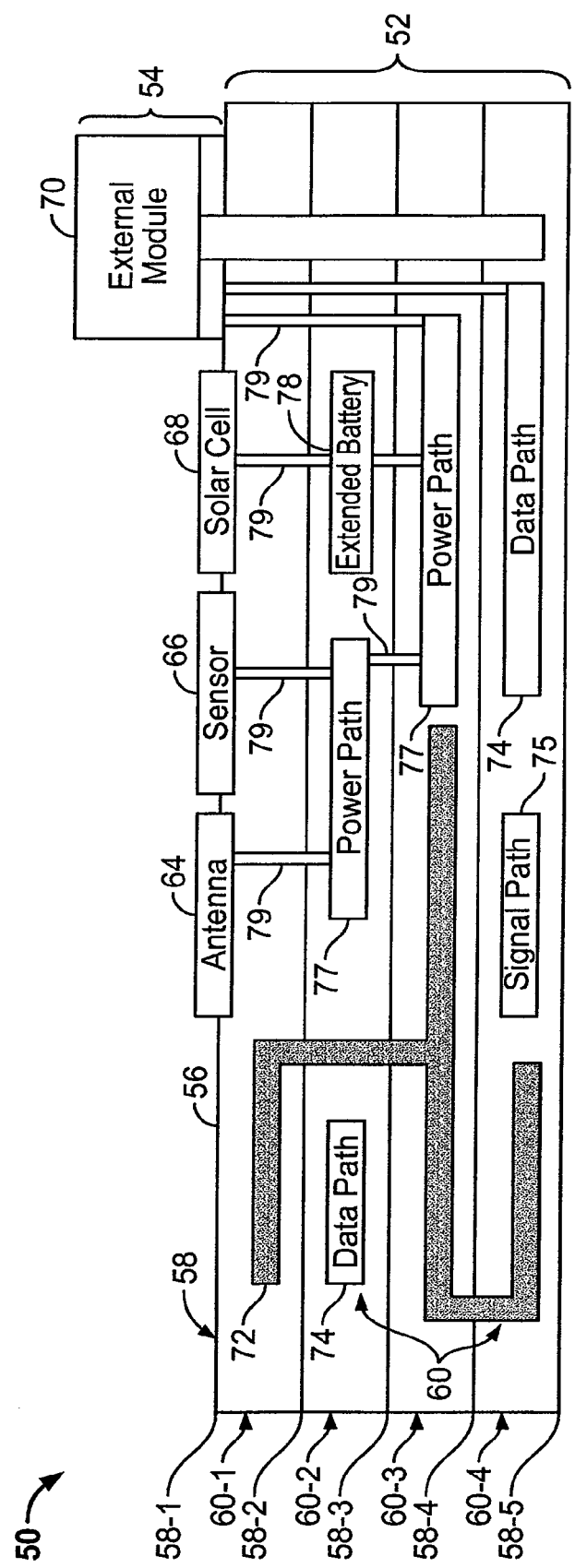
FIG. 2 is a somewhat schematic view of an operating system which forms part of the system of a first embodiment of the present invention.

With reference first being made to FIG. 2, the operating assembly 50 of a first embodiment of the present invention comprises a base section 52 and an operating section 54 that is combined with the base section 52 and which will be described in more detail later herein. The base section 52 is shown schematically in a format to identify the various components and indicate generally their physical arrangement and also their functions. The base section 52 of the first embodiment carries the operating section 54 at an upper surface 56 at the base section 52, and comprises a structural section 58 and a function support section 60.

The structural section 58 is a multi-layer section and in FIG. 2, the layers are simply shown schematically as five vertically spaced horizontal lines which indicate the locations of the five structural layers indicated at 58-1, 58-2, 58-3, 58-4, 58-5. This structural section 58 of the base section 52 contains the various paths and components of the function support section 60, and also provides an interface with the components of the operating section 54. Further, the structural section 58 may provide structural support for all or at least one of the components of the operating assembly 50. Further, other portions of the structural section 58 could simply serve as separators between various layers of the function support section 60.

The function support section 60 is also arranged so as to be located in function support regions. In the embodiment depicted in FIG. 2, there are four such function support regions, and these are indicated at 60-1, 60-2, 60-3, and 60-4. Each of these regions is positioned between adjacent surfaces of an adjacent pair of the structural layers 58-1 through 58-5. Thus, the structural layers 58-1 through 58-5 are positioned in an alternating pattern with the function support regions 60-1 through 60-4.

Figure 3:
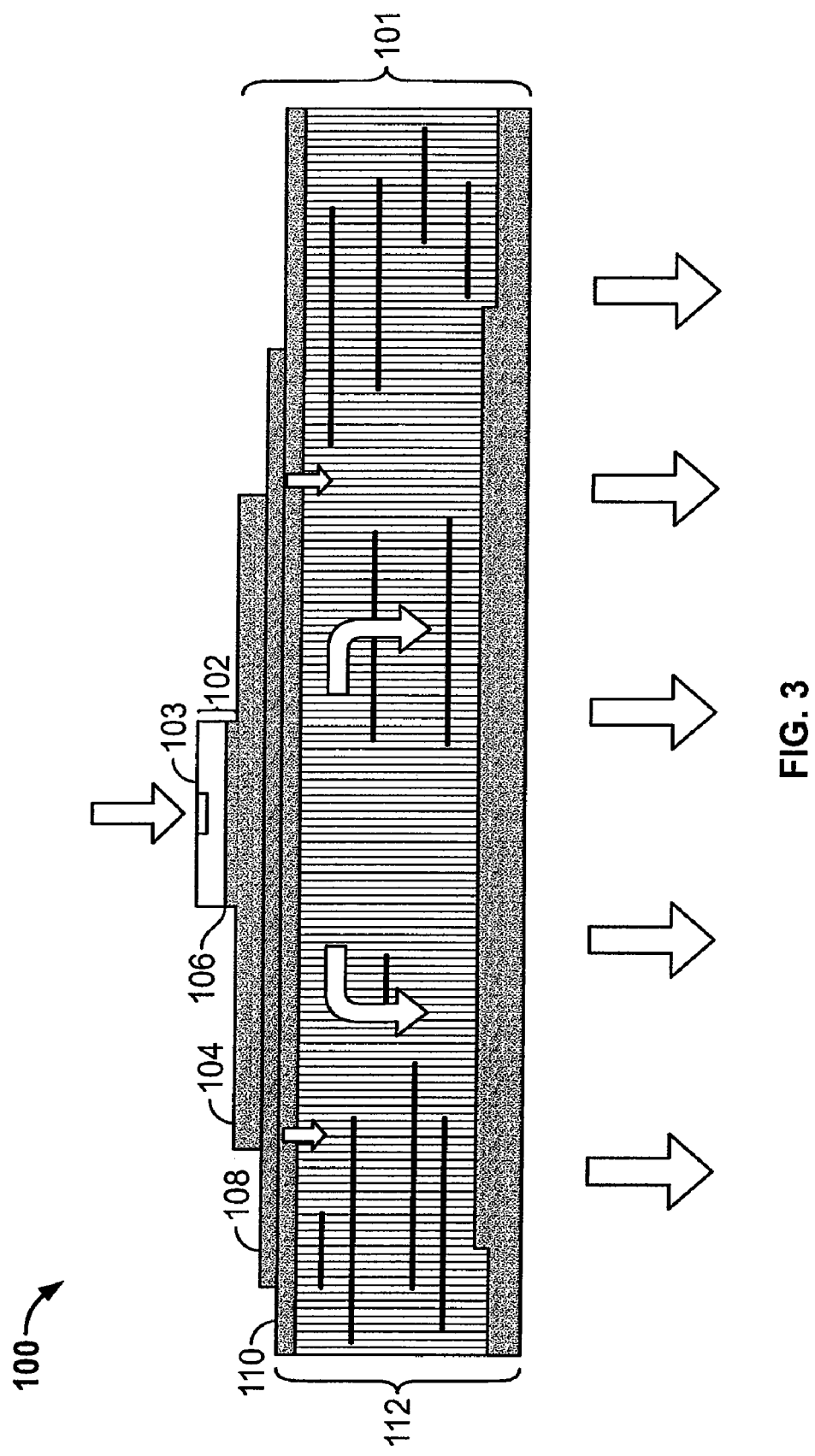
FIG. 3 is a semi schematic side elevational view, partly in section, illustrating this first embodiment of the present invention.
Figure 4:
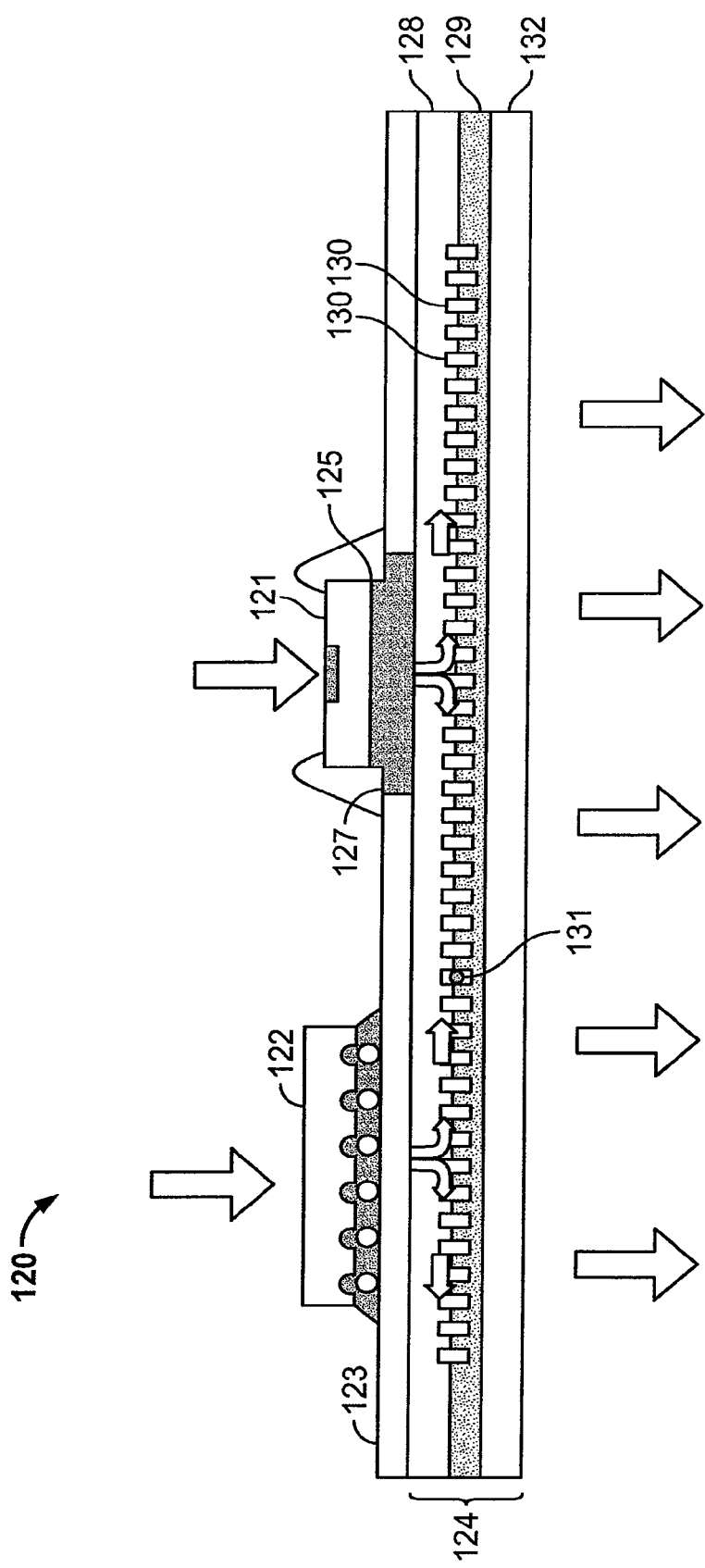
FIG. 4 is a view similar to FIG. 3 showing a second embodiment.

To turn our attention briefly to the operating section 54, in FIG. 2, there are shown four operating components. For ease of description, only four operating components are shown, this being done with the understanding that other components such as shown in FIGS. 3 and 4 could be mounted to the substrate/muting layer (to be described later) and/or could be mounted to the base section 52. The four operating components shown in FIG. 2 are an antenna 64, a sensor(s) section 66, a solar cell section 68, and an external module 70. These components 64, 66, 68 and 70 are mentioned only briefly at this point so that the functional relationships of the base section 52 with these operating components 64, 66, 68 and to the base section 52 can be discussed more effectively. The design features of the components shown in FIGS. 3 and 4 of the operating section will be described in more detail later herein.

This external module 70 could be anyone or more of a number of components. For example, the module 70 could be a mechanical device, a motor operating in conjunction with mechanical actuators and other mechanical elements, etc. Or it could perform various operations that are external of the functions dealing directly with the operation of the spacecraft, such as performing manipulations in conjunction with other spacecraft, deploying and receiving certain items exterior of the spacecraft, etc.

The other three operating components, namely the antenna 64, the sensor section 66, and the solar cell 68 perform function as suggested by the descriptive names by which these are identified. Thus, the antenna could be used for both transmitting and receiving electromagnetic transmissions. The sensor(s) section 68 could be performing a variety of functions relative to monitoring conditions within the spacecraft or exterior of the spacecraft. The solar cell section 68 could, as it's name implies, convert solar energy to useful electricity. Other components could be added to act as a radiator to radiate away unwanted heat and also absorb heat from other components.

To now turn our attention back to the function support section 60, it first has to be recognized that in the prior art each operating component would, in various prior art arrangements, have miscellaneous exterior connections to various separate function support devices, to obtain power, data, control signals, dissipating or absorbing heat energy to provide the proper thermal balance, etc. In the embodiments of the present invention, all (or at least most) of these various support function paths and components are located within the base section 52 and this multiplicity of external connections are eliminated.

In the rather schematic drawing of FIG. 2, function support paths 72, 74, 75, and 77, and function support component 78 are shown, namely thermal path 72 (which could be a conventional heat pipe, a nanotube conductive path, or other heat conductive component), data paths 74, signal path 75, power paths 77, and embedded battery 78. It can be seen that the function support paths and function support components are shown as having their physical location distributed among the four function support regions 60-1 through 60-4. Also, there are vertical connections 79 between some of these function support paths and the function support component. It is noted that the function support paths transmit either power, data, signals and/or thermal distribution. The embedded battery connects to the solar cell and stores energy.

No attempt is being made in the schematic drawings of FIG. 2 to show all the various connections that would be made if the design details were included. For example, with regard to the power paths 77 there are two horizontal power paths 77 and there are also two vertical power path connections, with one going to the antenna, another to the sensor, another to the external module. A more complete presentation of a base section which is substantially the same as, or very similar to, the base section 52 shown only schematically in FIG. 2, is presented in FIGS. 5-13 and is described more completely later in this text. As illustrated in FIGS. 5-13 various function support components and function support paths also may have various vertical connections throughout the base section 52 of FIGS. 5-13 so that there can be transmitting and receiving of functional services and communications from and to various function support components, as well as making functional connections between the operating components.

The base section 52 can be made as a single self contained section or unit that can provide a substantial number of the support functions for a member of operating components or units. Further, a number of these operating units can be either permanently or semi-permanently mounted (or operatively connected/attached to) the base section 52, or be mounted/connected to the base section 52 by plug-in connections, while others could be fixedly connected.

Nanotechnologies can advantageously be used to provide elements embedded or associated with paths (e.g. thermal, power, signal, and data), control devices (e.g. switch and valve), sensors (e.g. temperature, vibration, strain, radiation and light), and "intelligent" devices (e.g. processor and Field Programmable Gate Array (FPGA)).

Nanotechnology refers to technology development at the atomic, molecular or macromolecular levels in length scale of approximately 1-100 nanometer range. Nanotechnology offers significant performance improvements over what is capable of today's technology. For example, Carbon Nanotube (CNT) is a new form of carbon configurationally equivalent to a two dimensional graphene sheet rolled into a tube. The nanotubes have diameters in the range of a few nanometers <100 nanometers) and their lengths vary from micrometers to millimeters, at current state of technology development.

Carbon nanotube has the potential to improve the strength over steel by several hundred times, improve thermal conductivity over aluminum by 600 times, and electrical conductivity over copper by orders of magnitude.

There are a number of advantages in using nanotube materials. The data signal, and power paths can be constructed with nano material exhibiting superior electrical conductivity. Also, the nano material exhibits superior thermal conductivity and can be used to construct the thermal paths (e.g. in terms of nano heat pipe). Such material is being currently developed in various. private and government institutions world wide. Also, nano sensors, such as optical and photovoltaic are also being developed by private companies and government institutions as are nano electromechanical systems (NEMS).

The base section 52 of the assembly 50 could be made either in whole or in part a structural member and thus one or more of the structural layers 58-1 to 58-5 could be made of thicker and/or stronger material while one or more of the structural layers 58-1 to 58-5 could be functioning more as dividing, insulating or shielding layers without any significant load bearing functions. Also, as indicated previously, various operating components could either be permanently or semi-permanently attached to the base, or they could simply be plug in items or those that are simply clamped into place, or otherwise operatively connected to the base.

With regard to the method or methods that could be used in constructing the base section 52, this could readily lend itself to mass production techniques where the structural layers 58-1 to 58-5 would be pre-made, with the vertical openings and/or communications links being provided or installed in each of these structural layers 58-1 to 58-5. Each of the structural layers 58-1 to 58-5 could be preassembled in a rigid, semi-rigid or possibly flexible structure, or partly preassembled along with placing function support components and function support paths in position separately. It would be possible that the structural layers 58-1 to 58-5 could be preformed in some manner to accommodate a particular configuration of one or more function support components and one or more function support paths. The structural layers could be connected to one another in a variety of ways, such as being bonded to one another, joined together by fusion, molding, or welding, or clamped together, held together by screws at their periphery, and in other ways which are already known in the prior art.

c) Further Description of Components of the Operating Section 54

Earlier in this text, under the heading "Background Art," there was a discussion of thermal control and also the associated problems of providing thermal paths for the heat that is generated. In this section there will be a discussion of further components and certain design features of the operating section 54, and more particularly the manner in which thermal control and heat dissipation is accomplished in the apparatus of the present invention relative to the functioning of the operating section 54 and the base section 52. In the following discussion, certain components are (or may be) substantially the same as (or similar to) components previously described in section "b" of this text. However, so that the discussion as it relates to this section "c" can be differentiated from other parts of the text, other numerical designations will be used.

In FIG. 3 there is shown a multilayer operating assembly 100 with a base section 101 which for ease of description is being shown in a yet more simplified form, but which could be substantially the same as (or very similar to) the corresponding base section 52 of the first embodiment and a later embodiment show in FIGS. 5-13. The assembly 100 further comprises an operating section 102 which has a number of operating components such as shown in FIG. 2. However, for ease of description, there is shown, as a component of the operating section 102, only a single die 103 which could be either an MMIC DIE or a ASIC DIE 103, mounted to a substrate/routing layer 104. In an actual installation, the substrate/routing layer 104 would likely extend over a larger area having possibly dozens or even hundreds of operating components 103 mounted thereon. Also, it is to be understood that operating components mentioned previously (i.e. the antenna 64, the sensor(s) section 66, the solar cell section 68 and the external module 70 could also be some of the components 103 as part of the operating section 102. Therefore, in the text that follows the numeral 103 will be used to designate not only the MMIC/ASIC DIE, but in a broader sense could apply to the other operating components of the operating section 102.

With further reference to FIG. 3, the MMIC/ASIC DIE 103 is a heat generating components which is mounted to substrate/routing layer 104 with a solder/epoxy interface layer 106 between the DIE 103 and the layer 104. Below the substrate/routing layer 104 there is a carbon thermal interface layer 108 made as a carbon nanotube layer that is in intimate contact with the lower surface of the substrate/routing layer 104. The lower surface of the carbon nanotube layer is in turn in intimate heat transfer contact with the upper surface 110 of a multi-layered panel 112 of the base section 101.

In FIG. 3, the size of the MMIC/ASIC 103 is obviously somewhat exaggerated relative to what would be the lateral dimensions of the substrate/routing layer 108, since as mentioned above, in an actual installation, there could hundreds of components including various electrical/electronic components (including MMICs and ASICs) and other components, all of which could be mounted to the same substrate/routing layer 104. Further, the single substrate/routing layer 104 could accomplish the routing requirements through its network of electric/electron lines contained therein of most or all of the components 103 mounted thereon, with no need of external connections.

The entire (or substantially entire) surface of the MMIC/ASIC DIE 103 is in intimate heat transfer contact with the substrate/routing layer 104. Also, as indicated above, the entire lower surface (or a substantial portion of the lower surface) of the substrate/routing area 104 is in engagement with the upper surface of the 110 of the multilayered panel 112.

The design of the base section 101 is, in a manner similar to (or substantially the same as) the base section 52, made as a plurality of horizontally extending structural layers, such as illustrated at 58-1 through 58-5 of FIG. 2, with the functional support layers 60-1 through 60-4 being positioned between the structural layers 58-1 through 58-5.

With regard to the overall operation of the assembly as shown in FIG. 3, the MMIC/ASIC DIE 103 and the other operating components will perform their usual functions. The substrate/routing layer 104 will perform the routing functions for the components 103. The necessary functional support relative to data, power, thermal control, etc. will (or may be) supplied using function support components and function support paths embedded in the functional support layers 60-1 to 60-4 through the substrate/routing layer 104 to the MMIC/ASIC DIE 103. However, some of these support functions from the base section 101 could be accomplished independently of the substrate routing layer 104.

With regard to the dissipation of heat generated by the MMIC/ASIC DIE 103, or other heat generating components, in large part, the heat will be dissipated by heat transfer from the MMIC/ASIC DIE 103 (or other component) through the substrate/routing layer 104, through the thermal interface layers 108, such as carbon nanotube interface into the multilayered panel 112 to be radiated from the heat radiating surface of the base section 101. The path of heat dissipation is shown by the block arrows in FIG. 3. In addition, the thermal paths provided in the multilayered base section 101 could be designed to be controlled through proper thermal valves to accomplish at least in part, the dissipating of the heat generating components 103.

d) A Second Embodiment of the Invention

FIG. 4 shows a second embodiment of the present invention. There is shown in cross-section an assembly 120 having two operating components, namely an MMIC/ASIC DIE 121 and a flip chip 122. The flip chip 122 is (possibly along with other operating components) mounted to a substrate/routing layer 123, which is in turn may be mounted to a thermal radiator section 124 as shown in FIG. 3. However, to incorporate the substrate/routing layer 123 with its operating components 121 and 122 with the base section, such as shown in FIG. 3, it would not be mounted to the thermal radiator section, but it would be mounted to the multilayer base as described in the first embodiment.

The MMIC/ASIC DIE 121 is bonded by a solder or epoxy interface 125 to an upper surface of a embedded heat spreader such as embedded CVD diamond heat sink or nano-enhanced thermal structure 127. This thermal structure 127 is at the same level as the substrate/routing layer 123.

The substrate/routing layer 123 may serve certain support functions in addition to a heat transfer function, and may have a large number of operating components mounted thereon. Thus, there would be supplied through this substrate/routing layer 123 various connections, such as power, communication, data, etc.

The thermal radiator section 124 is made up of four layers. First, there is an upper layer 128 which is heat conductive and may be made of silicon, and immediately below this layer 128 there is a second thermal conductive layer 129 which may be made from an aluminum silicon alloy. These two layers 128 and 129 are constructed so that they have adjacent surfaces facing one another, and there are at these surfaces matching recesses 130. Within these recesses 130 there are embedded micro-heat pipes 131. For convenience of illustration, only one of these heat pipes 131 is indicated simply by a black dot in the cavity formed at a pair of matching recesses 130. These can be provided with nanoenhanced MEM heat transfer valves.

Below the lower layer 129 of an aluminum silicon alloy, there is a thermal radiator 132 which may be made, for example, of quartz mirrors with active thermal sensitivity control.

In operation, the two operating components (i.e. the MMIC/ASIC DIE 121 and the flip chip 122) and other operating components function in their usual manner. The thermal transfer, as shown by the block arrows in FIG. 4, is accomplished by the heat from the operating units 121 and 122 being transmitted into the substrate/routing layer 123 downwardly and laterally into the underlying thermal radiator section 124. The heat spreads downwardly and laterally throughout the thermal radiator section 124 to be dissipated as radiation through the thermal radiator layer 132.

In the second embodiment, the operating components (i.e., the MMIC/ASIC DIE 121 and the flip chip 122 as well as others) are mounted directly to the substrate with the heat being radiated directly from the thermal radiator section 124. However, as indicated above it is evident that these two components 121 and 122 with the substrate/routing section 123 could be mounted to a base section such as indicated at 52 and 101 in this text in the manner described earlier in the text.

e) Further Description of the Base Section

Earlier in this text, in describing the first embodiment with reference to FIGS. 2-4, it was indicated that no attempt was being made at that point of the text to show all the various connections that could be made if the design details were included. It further indicated that more complete presentation of a base section which is substantially the same as, or very similar to, the base section 52, would be presented in FIGS. 5-13.

For ease of description, components of this section of the text which correspond to certain components of the first and second embodiments will not be given the same designations that was done in the description of those embodiments, and a new set of numerical designations will be given throughout this presentation that is a more detailed description of the base section.

Figure 5:
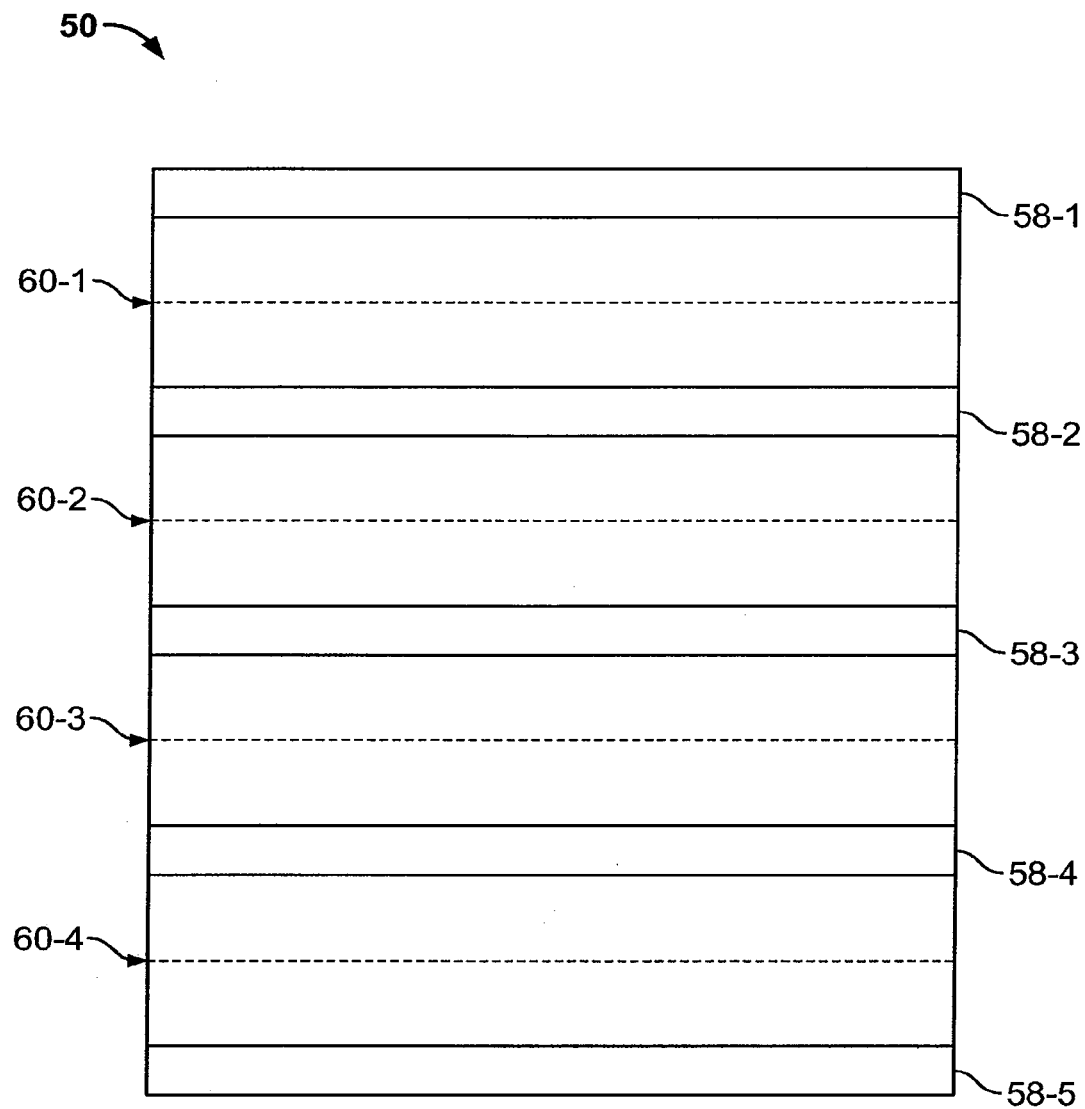
FIG. 5 is a schematic view indicating the locations of the structural layers and functional support regions of the base.

FIG. 5 is a rather schematic drawing which is similar to the previously submitted FIG. 2, where it shows only schematically the layers of the structural section and the function support section. These are presented simply to give the numerical designations that will be used in the following description.

Figure 6:
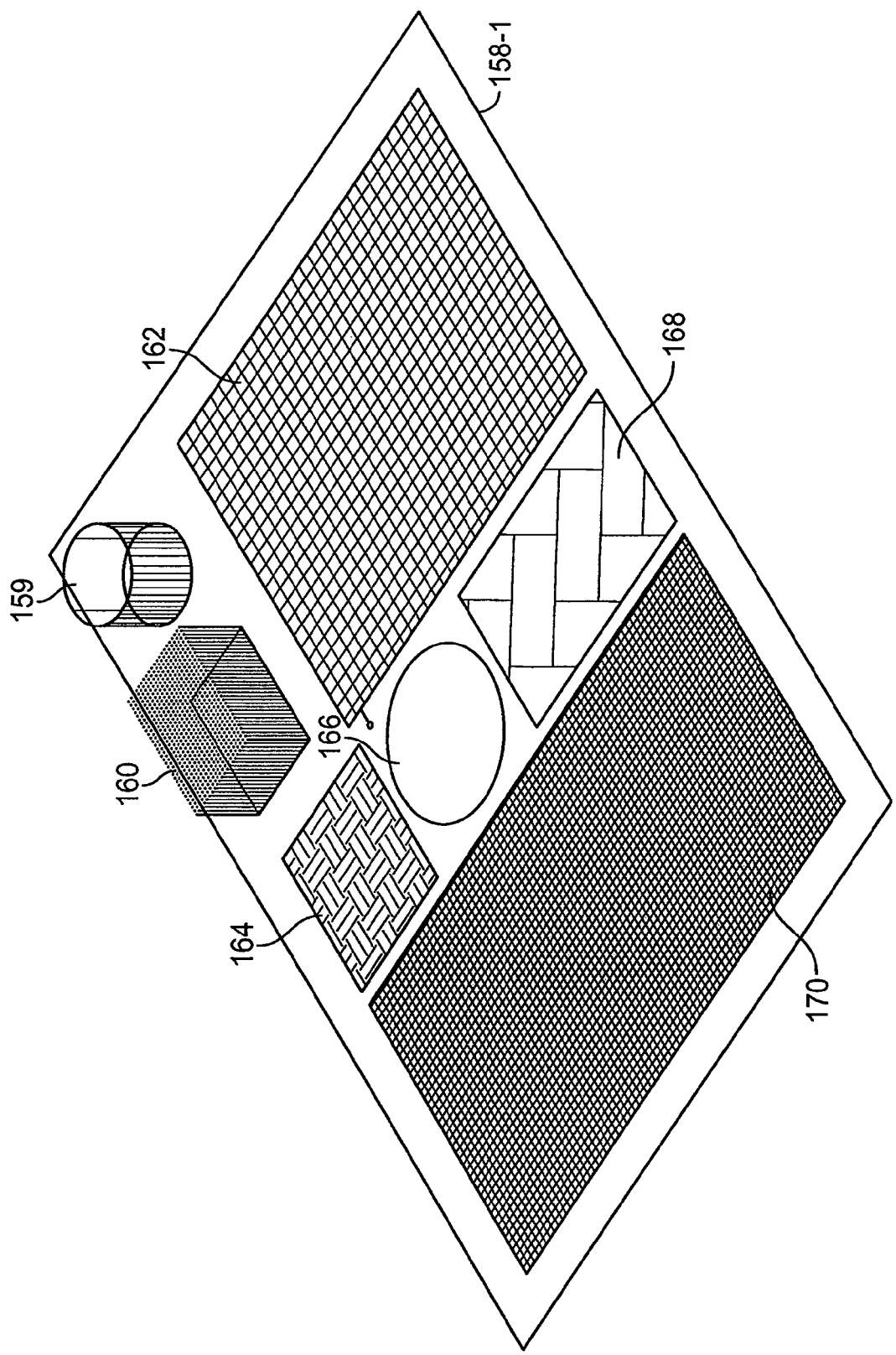
FIGS. 6-13 are somewhat schematic drawings showing in sequence the several structural and function support layers and combinations of some of the same.

As a further introductory comment, it will be noted that in FIG. 6 there is shown the top portion of the base which carries certain components of the operating section. As shown in FIG. 6, these components extend over the entire upper surface of that portion of the top of the base that is shown. This is done primarily for convenience of illustration, and it is to be understood that in the actual embodiment, further components such as shown in FIGS. 3 and 4 would be added, as well as the substrate/routing section that has been described in detail previously herein.

With these introductory comments being made, let us now turn our attention to FIGS. 6-13.

Reference is first made to FIG. 6, where there is shown the first structural layer 158-1. As indicated earlier in this text, this embodiment of FIG. 6 is shown somewhat schematically, and it is to be understood that the arrangement of these operating components could in an actual structure, such as a space satellite, not necessarily be the same as shown in FIG. 6, and examples of this will be mentioned briefly in the following paragraph.

The first structure layer 158-1 has on its upper surface seven operating components, namely a processor 159, a traveling wave tube (TWT) 160, a solar array 162, a receiving antenna 164, a transmitting antenna 166, a sensor(s) section 168, and a heat sink 170. It is to be understood that the terms "upper" and "lower" are not intended to denote the position of these components relative to any gravitational or other force (e.g. centrifugal), but rather are simply used to denote relative locations, since a number of these assemblies could be positioned at different angles and orientations.

While these operating components 159-170 are shown positioned at one surface of a spacecraft of satellite, there could be some repositioning of these components 159-170. For example, the solar array 164 could be positioned at a different location where it could be exposed to sunlight while the heat sink 170 would quite possibly be shielded from the sun so it could more readily have a net discharge of heat as radiation into space. Also, the solar array could be one side of the spacecraft or satellite, and the traveling wave tube 160 and the processor 159 could be positioned on the another side of the multilayer operating assembly so that these would be at an interior location where the temperature of these components could be controlled more easily. Also, it would be possible that one or more of the operating components may be positioned as one of the function support components and vice versa.

Figure 7:
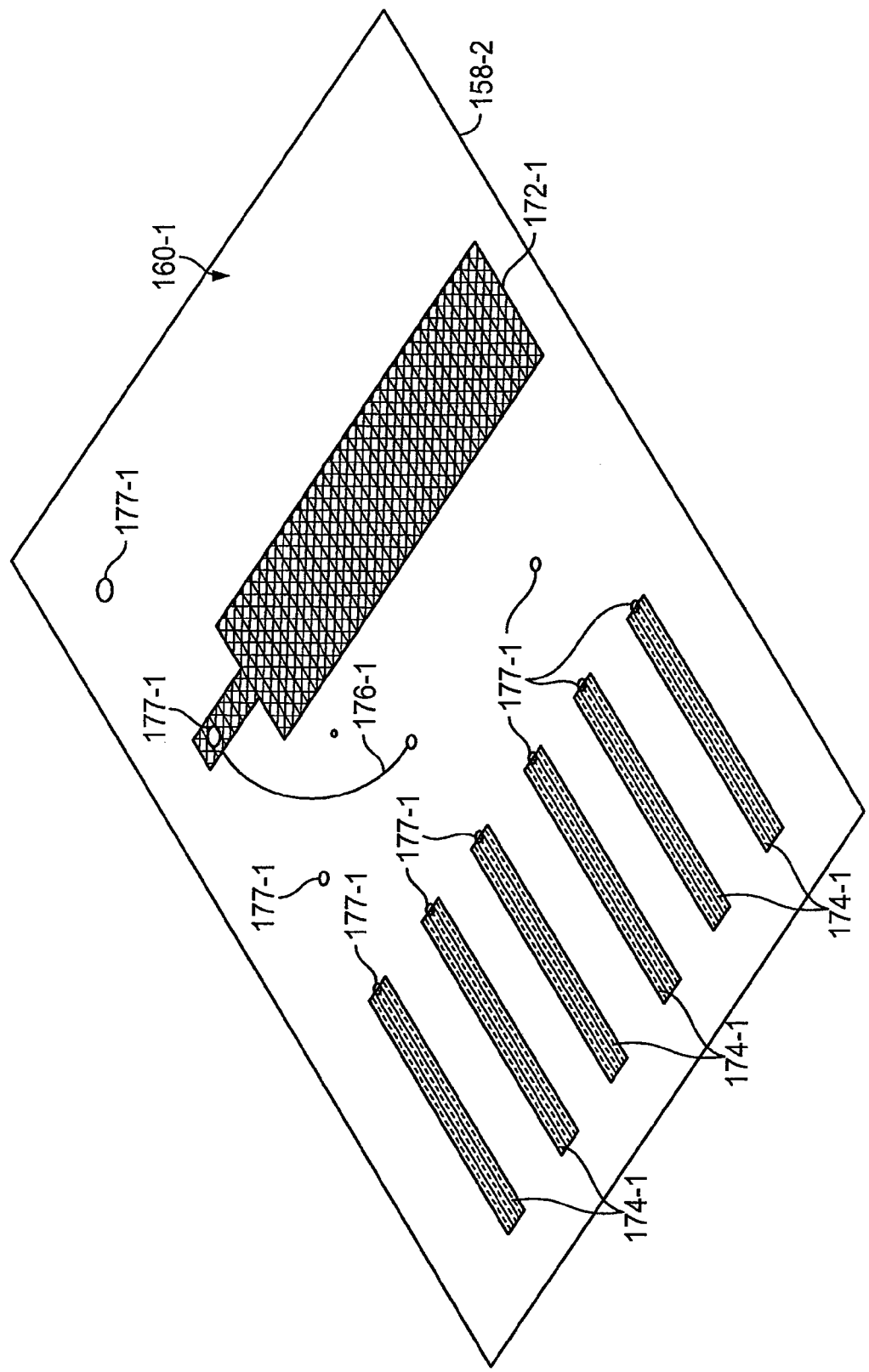

In FIG. 7, the second support layer 158-2 is shown, and also the function support components that are in the first function layer 160-1. There is a radio frequency electronics member 172-1, and the "–1" is given so that this will identify this member 172 as being in the first function support layer 160-1.

Then there is also in this first function support layer 160-1 six heat pipes 174-1. Third there is a communication link 176-1 in the form of a conductive elongate member (i.e. an electric wire) 176-1 extending from the radio frequency electronics member 172-1 so that a connection can be made to the transmit antenna 166. Also, there are several openings or vertical connections 177-1 which enable vertical communication/transmission to operating components, such as the processor 159, the traveling wave tube 160, etc.

It is to be understood that the term "function layer" (and in this case function layer 160-1) does not necessarily mean that there is a physical layer that occupies the entire area between the upper and lower structure layers 158-1 and 158-2. Rather, the term "function layer" could also be properly termed a function layer region 160-1 where the various components 172-1, 174-1 and 176-1 would be located, This would depend, of course, on various factors, such as the procedure used in locating these members 172-1, 174-1 and 176-1. For example, prior to assembling the entire multi-layer operating assembly 50, these components 172-1, 174-1 and 176-1 could be positioned on a sheet of material in their desired position, and then this sheet of material with these components 172-1, 174-1 and 176-1 could be positioned between the structure layers 158-1 and 158-2 and possibly an amount of filler material of some sort could also be positioned on the sheet of locating material to provide for the structural integrity of the entire assembly.

Figure 8:
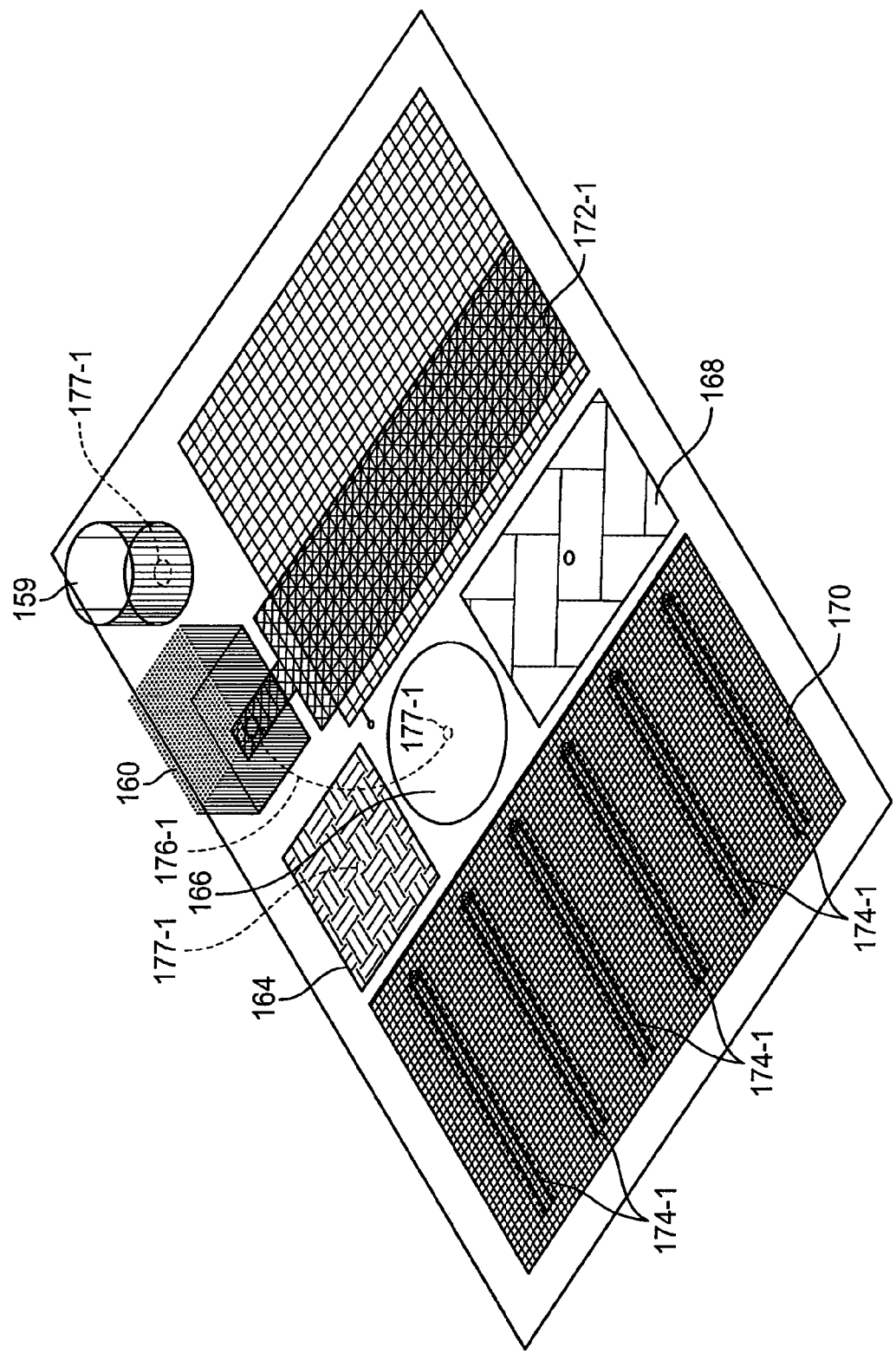

In FIG. 8, there is shown an overlay of the components 159-170 of FIG. 6 with the function support components 172-1, 174-1 and 176-1 of the first function support layer 160-1. It can be seen that the link 176-1 is being made from the traveling wave tube 160 to the transmitting antenna 166, and all of the six heat sink pipes 174-1 are immediately next to, and in thermal connection with, the beat sink 170.

Figure 9:
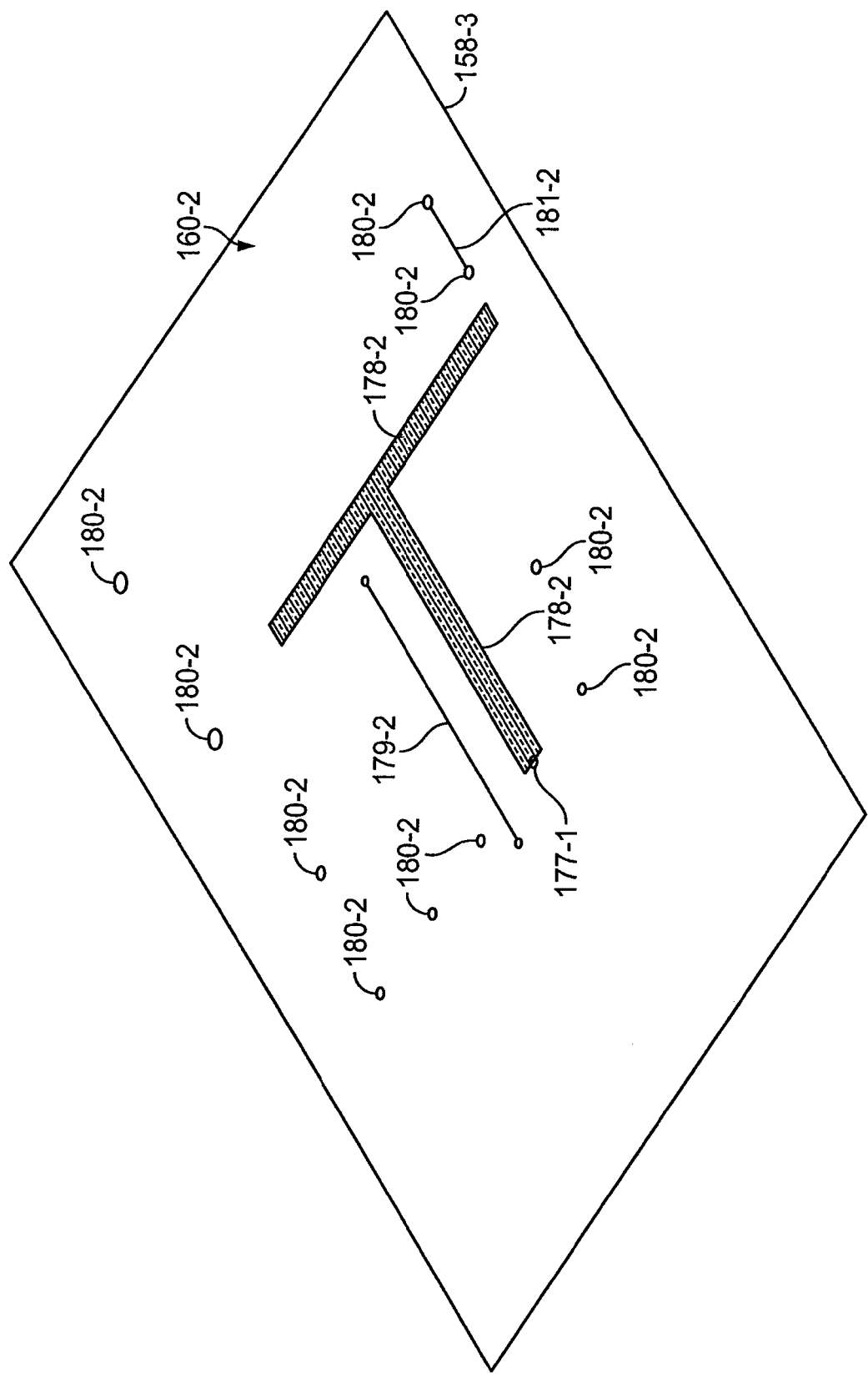

In FIG. 9, there is shown the third structural layer 158-3, and it can be seen that there is a "T" shaped heat pipe member 178-2, (with the "–2" indicating its location in the function support layer 160-2). There is also shown a data path 179-2 in the form of an electric wire or other data transmitting member. Then there are a number of through openings (or opening locations), indicated at 180-2 to provide vertically oriented connection openings to enable vertical links to be made between various function support components and function support paths. Finally, there is also yet another data path 181-2, and there are two openings 180-2 at opposite sides of the data path link 181-2.

Figure 10:
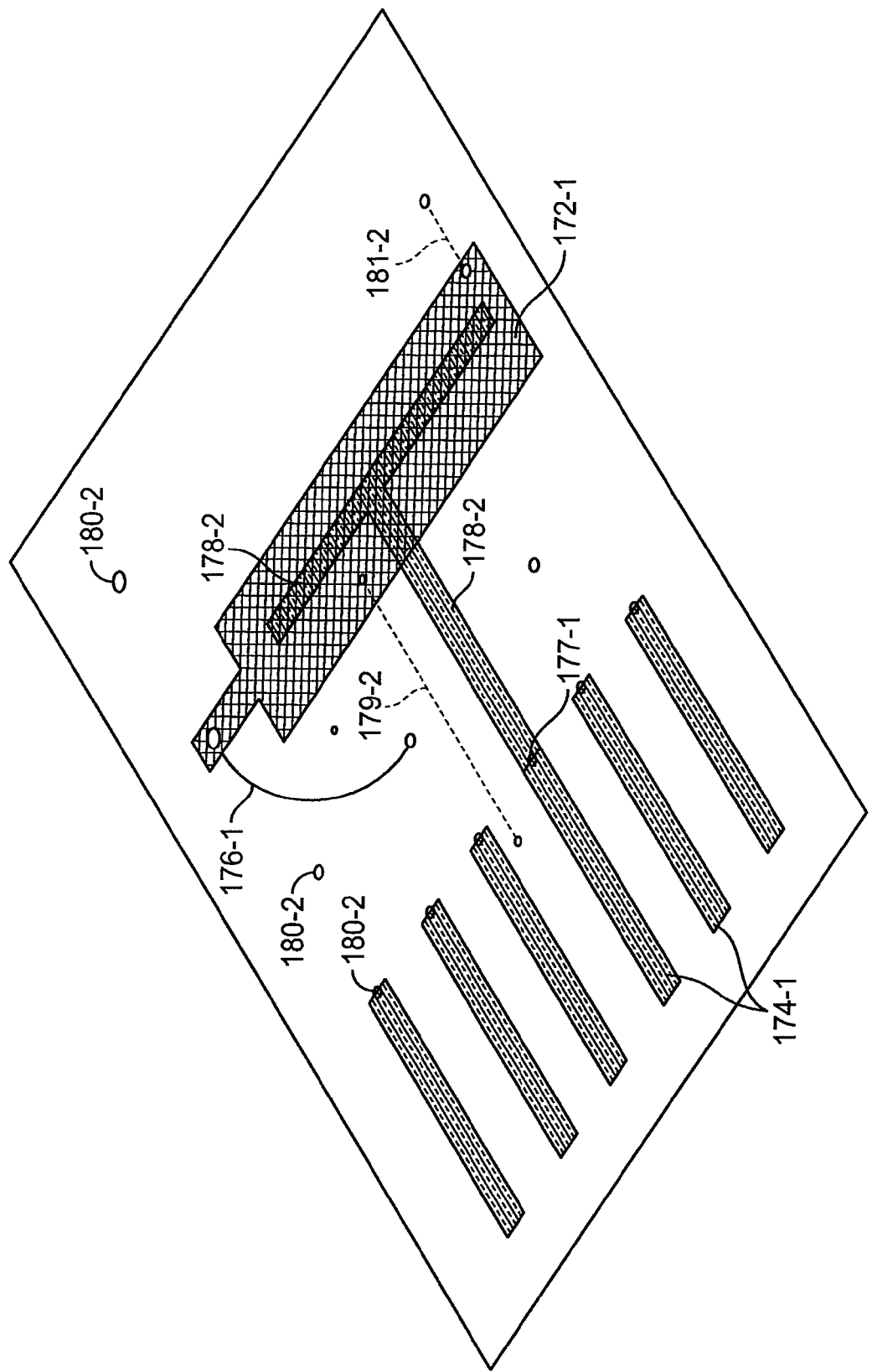

Next we turn to FIG. 10 which is an overlay of the layers of function support components of FIGS. 9 and 7. There is the connecting opening 177-1 through which the connection is made between the two of the heat pipe components 174-1 and 178-2.

Figure 11:
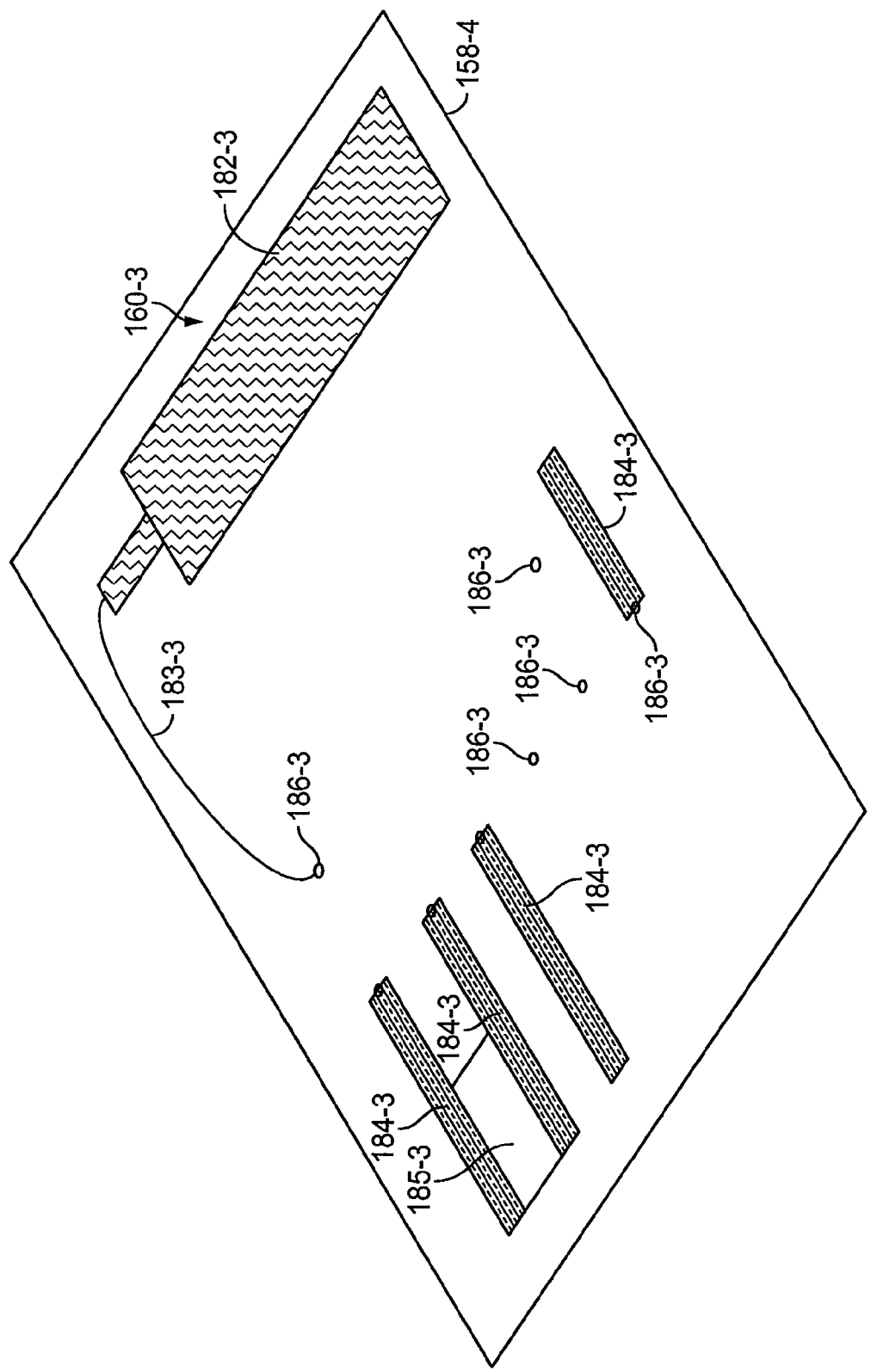

In FIG. 11 there is the third function support layer 160-3, and the fourth structural layer 158-4. There are provided a digital electronics member 182-3, having a link 183-3 to the antenna/receiver 164 and a set of four heat pipes 184-3. Further, there is a power converter 185-3, and a number of vertical openings 186-3.

Figure 12:
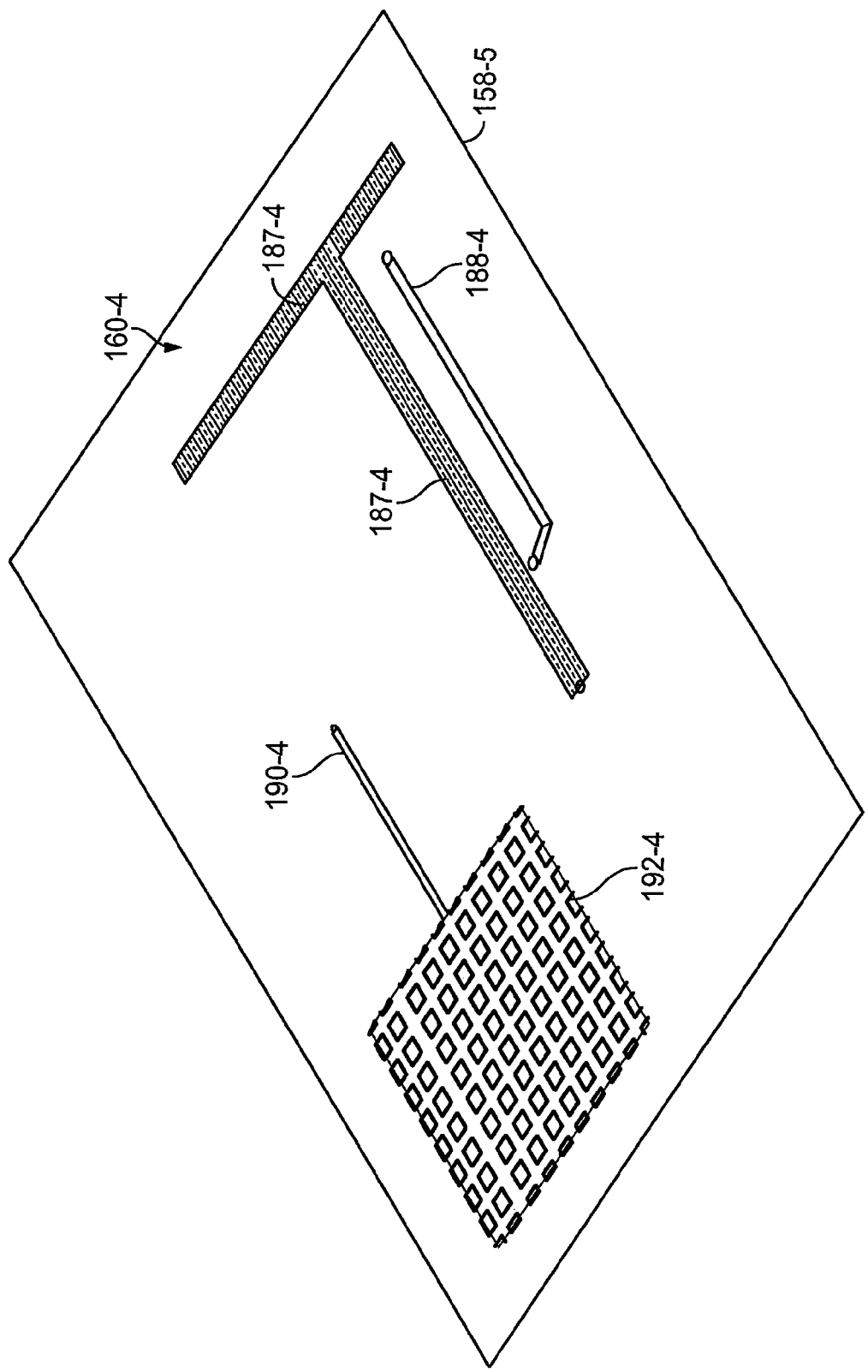

Next we turn our attention to FIG. 12, which shows the fourth function support layer 160-4 and the fifth structural layer 158-5. There are shown four function support components. First, there is the "T" shaped heat pipe member 187-4, then a data path communication link 188-4, a further data path communication link 190-4 and a power converter (e.g. control electronics) 192-4.

Figure 13:
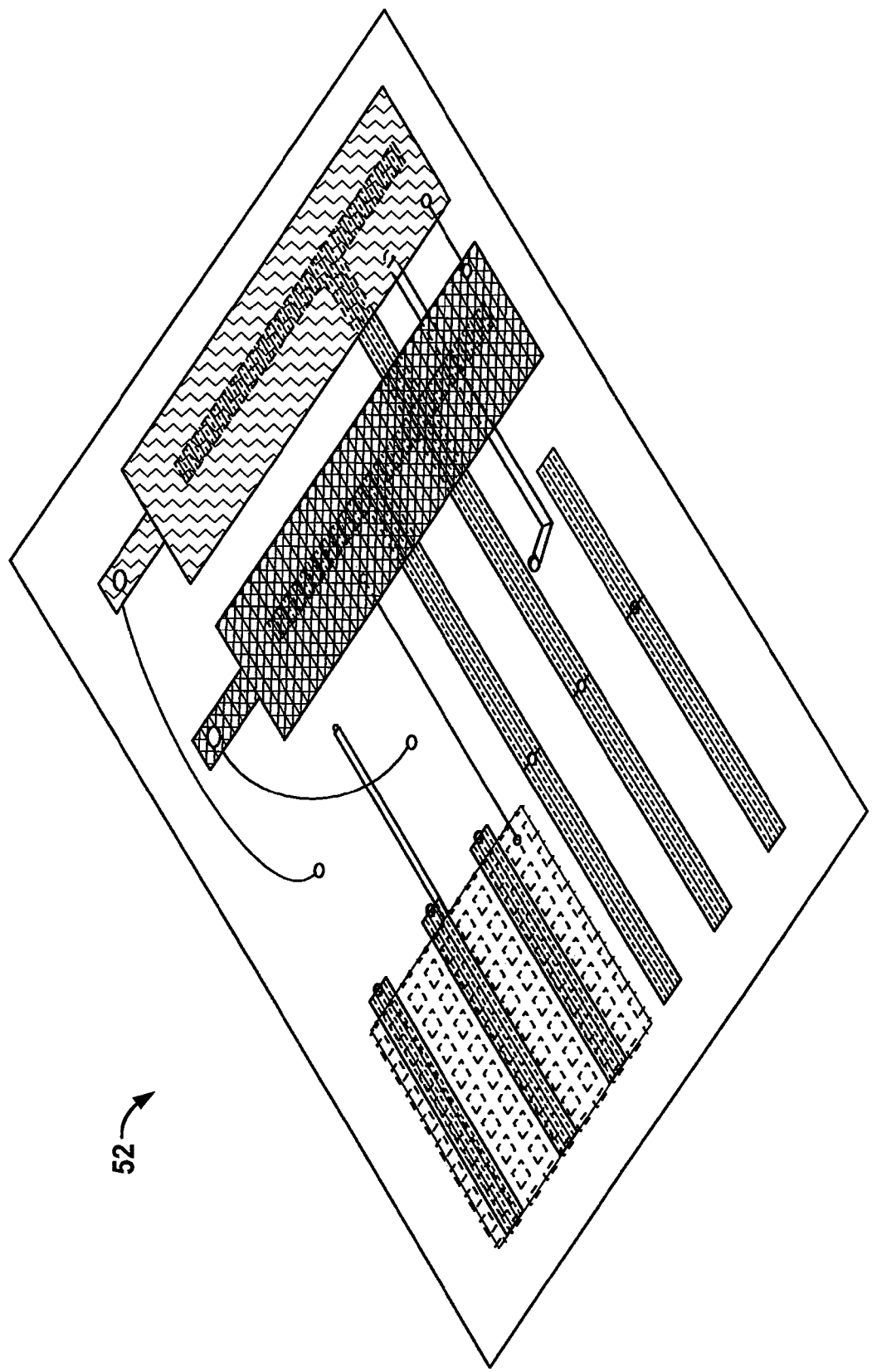

Now we turn our attention to FIG. 13 which shows all four of the function support layers 160-1, 160-2, 160-3, and 160-4, with all of these overlying one another in that order. To facilitate viewing of this composite of all four function support layers, none of the numerical designations are given.

It can be seen that various sections of paths in the same category are present in different function support layers. For example, there are data paths in all four of the function support layers 160-1 through 160-4, and there are heat pipes present in all four of the function support layers 160-1 through 160-4, with all of these ultimately connecting to the six heat pipes 174-1 that are shown in FIG. 7, and also in FIG. 8. Further, it can be seen that the data path -2 extends between and makes connections with, the digital electronics -3 and the RF electronics -1. Further, all of the operating components that appear in FIG. 3 have the proper connections with the various function support components and function support paths in the underlying function support layers or regions 160-1 through 160-4 as required by each of those operating components.

It is obvious that various modifications could be made in these embodiments without departing from the basic teachings of the present invention.

We claim:

1. A fully integrated operating assembly comprising:
   an operating section comprising a plurality of operating components comprising a plurality of the following: an antenna, a sensor, a solar cell, a mechanical device, a motor, a traveling wave tube, and a solar array;
   a base section to which the operating section is mounted, the base section comprising:
      a structural section comprising a plurality of structural layers;
      a function support section comprising a plurality of function support regions, the function support regions positioned between the plurality of structural layers;
      the function support section further comprising a plurality of function support paths and at least one function support component, the function support paths and the at least one function support component being positioned within the function support regions, wherein the function support paths comprise a plurality of the following: at least one thermal path for transmitting thermal distribution, at least one data path for transmitting data, at least one signal path for transmitting signals, and at least one power path for transmitting power, and wherein the at least one function support component comprises at least one of an embedded battery, a heat pipe, a communication link, a power converter, and a control device; and
      vertical connections extending between the operating components, the structural layers, the function support paths, and the at least one function support component;
   wherein the function support paths and the vertical connections transmit between the operating components, the structural section, the function support section, and the at least one function support component in order to provide the fully integrated operating assembly with a plurality of the following: said thermal distribution by distributing heat from the operating components using the at least one thermal path and the vertical connections, said data using the at least one data path and the vertical connections, said signals using the at least one signal path and the vertical connections, and said power using the at least one power path and the vertical connections.

2. The operating assembly of claim 1 wherein the function support paths are operatively linked to the operating components.

3. The operating assembly of claim 1 wherein the function support paths comprise each of the at least one thermal path transmitting the thermal distribution within the operating assembly, the at least one power path transmitting the power within the operating assembly, the at least one data path transmitting the data within the operating assembly, and the at least one signal path transmitting the signals within the operating assembly.

4. The operating assembly of claim 1 wherein the at least one function support component comprises a plurality of the embedded battery, the heat pipe, the communication link, the power converter, and the control device.

5. The operating assembly of claim 1 wherein the plurality of function support paths comprise at least one of a nanotube and a carbon nanotube.

6. The operating assembly of claim 1 further comprising a substrate/routing section positioned between the operating section and the base section such that at least some heat generated in the operating section is dissipated through the substrate/routing section.

7. The operating assembly of claim 6 wherein the substrate/routing section is adapted to allow the function support paths to be operatively linked to the operating components.

8. The operating assembly of claim 7 wherein the substrate/routing section is adapted to allow the operating components to be operatively linked to one another.

9. The operating assembly of claim 1 wherein the operating components further comprise at least one of a chip, a heat sink, and a processor.

10. The operating assembly of claim 3 wherein the at least one function support component comprises a plurality of the embedded battery, the heat pipe, the communication link, the power converter, and the control device.

11. A method of providing functional support to operating components in a fully integrated operating assembly comprising:
   securing an operating section, comprising a plurality of operating components, adjacent to a base section, wherein the operating components comprise a plurality of the following: an antenna, a sensor, a solar cell, a mechanical device, a motor, a traveling wave tube, and a solar array, and wherein the base section comprises a structural section comprising a plurality of structural layers, and a function support section comprising a plurality of function support regions, the function support regions positioned between the plurality of structural layers;
   positioning within the function support section a plurality of function support paths and at least one function support component comprising at least one of: an embedded battery, a heat pipe, a communication link, a power converter, and a control device, wherein the function support paths comprise a plurality of the following: at least one thermal path, at least one data path, at least one signal path, and at least one power path;
   operatively linking the operating components, the function support paths, and the at least one function support component with vertical connections extending between the operating components, the structural layers, the function support paths, and the at least one function support component; and
   transmitting at least one of: thermal distribution by distributing heat from the operating components using the at least one thermal path and the vertical connections, data using the at least one data path and the vertical connections, signals using the at least one signal path and the vertical connections, and power using the at least one power path and the vertical connections.

12. The method of claim 11 wherein the step of positioning the function support paths further comprises positioning the function support paths in every one of the function support regions.

13. The method of claim 11 wherein the step of positioning the at least one function support component further comprises positioning the at least one function support component in more than one of the function support regions.

14. The method of claim 11 wherein the step of positioning the function support paths further comprises positioning within the function support regions each of the at least one of thermal path, the at least one power path, the at least one data path, and the at least one signal path.

15. The method of claim 11 wherein the step of positioning the at least one function support component further comprises positioning within the function support regions a plurality of the heat pipe, the embedded battery, the communication link, the power converter, and the control device.

16. The method of claim 11 further comprising constructing the function support paths of at least one of nanotube and carbon nanotube.

17. The method of claim 11 further comprising positioning a substrate/routing section between the operating section and the base section such that at least some heat generated in the operating section dissipates through the substrate/routing section.

18. The method of claim 17 further comprising operatively linking the function support paths to the operating components through the substrate/routing section.

19. The method of claim 17 further comprising operatively linking the at least one function support component to the operating components through the substrate/routing section.

20. The method of claim 11 wherein the operating components further comprise at least one of a chip, a heat sink, and a processor.

* * * * *

UNITED STATES PATENT AND TRADEMARK OFFICE
CERTIFICATE OF CORRECTION

PATENT NO. : 7,583,506 B1  Page 1 of 1
APPLICATION NO. : 11/250817
DATED : September 1, 2009
INVENTOR(S) : Huang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 170 days.

Signed and Sealed this

Fourteenth Day of September, 2010

David J. Kappos
*Director of the United States Patent and Trademark Office*